United States Patent
Boehme

(10) Patent No.: US 10,109,444 B2
(45) Date of Patent: Oct. 23, 2018

(54) ELECTRONIC MODULE FOR PROTECTING A HVDC CONVERTER FROM CURRENT SURGES OF ENERGY DISCHARGES FROM A CAPACITOR OF THE CONVERTER

(71) Applicant: SIEMENS AKTIENGESELLSCHAFT, Munich (DE)

(72) Inventor: Daniel Boehme, Nuremberg (DE)

(73) Assignee: Siemens Aktiengesellschaft, Munich (DE)

(*) Notice: Subject to any disclaimer, the term of this patent is extended or adjusted under 35 U.S.C. 154(b) by 179 days.

(21) Appl. No.: 15/104,305

(22) PCT Filed: Dec. 17, 2013

(86) PCT No.: PCT/EP2013/076923
§ 371 (c)(1),
(2) Date: Jun. 14, 2016

(87) PCT Pub. No.: WO2015/090367
PCT Pub. Date: Jun. 25, 2015

(65) Prior Publication Data
US 2016/0379790 A1    Dec. 29, 2016

(51) Int. Cl.
*H01H 79/00* (2006.01)
*H02H 7/12* (2006.01)
(Continued)

(52) U.S. Cl.
CPC ............ *H01H 79/00* (2013.01); *H01L 23/62* (2013.01); *H02H 7/12* (2013.01); *H01H 1/20* (2013.01);
(Continued)

(58) Field of Classification Search
CPC .............. H01H 1/20; H01H 2203/026; H01H 2235/00; H01H 79/00; H01H 39/004;
(Continued)

(56) References Cited

U.S. PATENT DOCUMENTS 4,972,056 A    11/1990   Wu
5,734,197 A    3/1998    Kelleher et al.
(Continued)

FOREIGN PATENT DOCUMENTS

CN    101232169 A    7/2008
CN    201877810 U    6/2011
(Continued)

*Primary Examiner* — Thienvu Tran
*Assistant Examiner* — Nicolas Bellido
(74) *Attorney, Agent, or Firm* — Laurence Greenberg; Werner Stemer; Ralph Locher

(57) ABSTRACT

An electronic module for protecting power semiconductor devices of an HVDC converter against high current surges and damaging electrical discharges includes a capacitor, a short circuit device, a movable portion, a short circuit portion and a spring element. The short circuit device is connected in parallel with the capacitor and has first and second busbars. The movable portion is connected to the first busbar and the short circuit portion is connected to the second busbar. The spring element is arranged between the movable portion and the short circuit portion. When a short circuit current flows through the first busbar, an electromagnetic force between the busbars causes the first busbar to repel the second busbar and move towards the short circuit portion. The latter provides a short circuit path connecting the first busbar to the second busbar short circuiting the capacitor and bypassing the power semiconductor devices of the HVDC converter.

9 Claims, 2 Drawing Sheets

(51) Int. Cl.
*H01L 23/62* (2006.01)
*H02M 1/32* (2007.01)
*H02M 7/483* (2007.01)
*H01H 1/20* (2006.01)

(52) U.S. Cl.
CPC ... *H01H 2203/026* (2013.01); *H01H 2235/00* (2013.01); *H01L 2924/13055* (2013.01); *H01L 2924/19041* (2013.01); *H01L 2924/30105* (2013.01); *H01L 2924/30107* (2013.01); *H02M 2001/325* (2013.01); *H02M 2007/4835* (2013.01)

(58) Field of Classification Search
CPC ............ H01L 23/62; H01L 24/37; H01L 2924/13055; H01L 2924/19041; H01L 2924/30105; H01L 2924/30107; H01L 2924/00014; H01L 2224/37099; H01L 23/642; H01L 25/072; H01L 25/16; H01L 2924/01013; H01L 2924/01033; H02H 7/12; H02M 2001/325; H02M 2007/4835; H02M 2007/4585; H02M 7/483
USPC .......................................................... 335/16
See application file for complete search history.

(56) References Cited

U.S. PATENT DOCUMENTS

| | | | | |
|---|---|---|---|---|
| 5,831,507 A | * | 11/1998 | Kasamatsu | H01H 9/10 337/4 |
| 5,859,579 A | * | 1/1999 | Branston | H01H 71/14 337/116 |
| 6,054,911 A | * | 4/2000 | Herbst | H01H 1/54 218/156 |
| 6,154,117 A | * | 11/2000 | Sato | H01H 1/66 337/354 |
| 8,081,486 B2 | | 12/2011 | Dorn | |
| 2002/0041476 A1 | * | 4/2002 | Petris | H01H 37/761 361/103 |
| 2007/0102269 A1 | * | 5/2007 | Hartmann | H01H 71/14 200/81 R |
| 2007/0267727 A1 | * | 11/2007 | Hu | H01L 23/49524 257/666 |
| 2008/0036561 A1 | * | 2/2008 | Hartinger | H01H 1/0015 335/156 |
| 2008/0207027 A1 | * | 8/2008 | Dorn | H01L 23/62 439/187 |
| 2009/0257165 A1 | * | 10/2009 | Dorn | H01H 71/43 361/100 |
| 2010/0315850 A1 | * | 12/2010 | J'Neva Devi | H02M 7/493 363/95 |
| 2012/0050935 A1 | * | 3/2012 | Douglass | H01C 7/126 361/103 |
| 2014/0313797 A1 | | 10/2014 | Davidson et al. | |

FOREIGN PATENT DOCUMENTS

| | | |
|---|---|---|
| EP | 0353369 A2 | 2/1990 |
| EP | 1894240 A1 | 3/2008 |
| GB | 2073494 A | 10/1981 |
| JP | 5034800 B2 | 9/2012 |
| WO | 2013071957 A1 | 5/2013 |

* cited by examiner

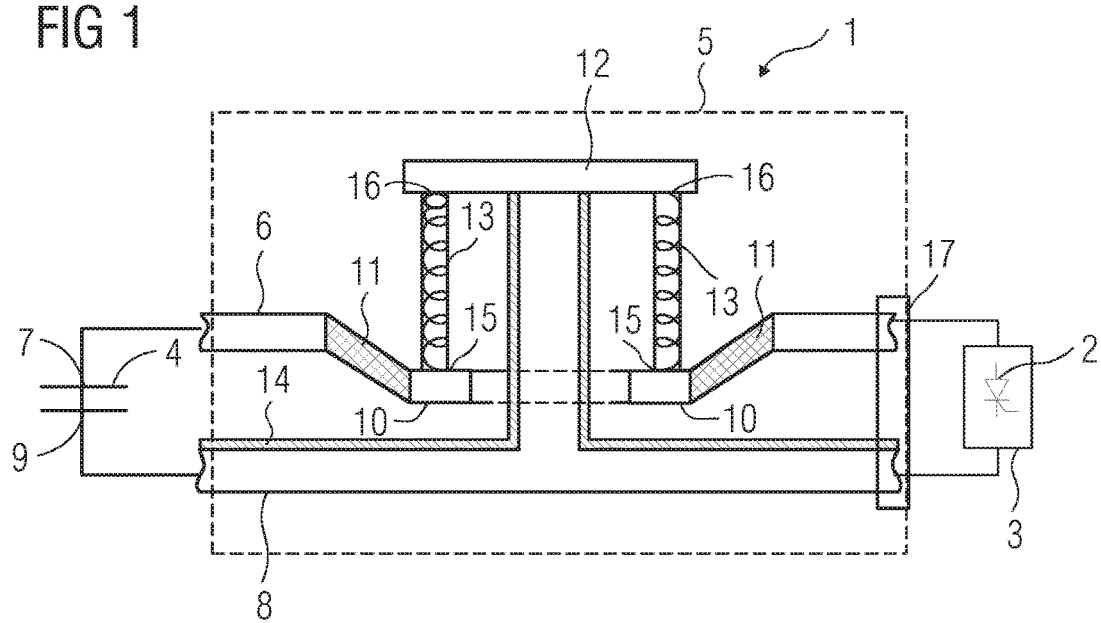
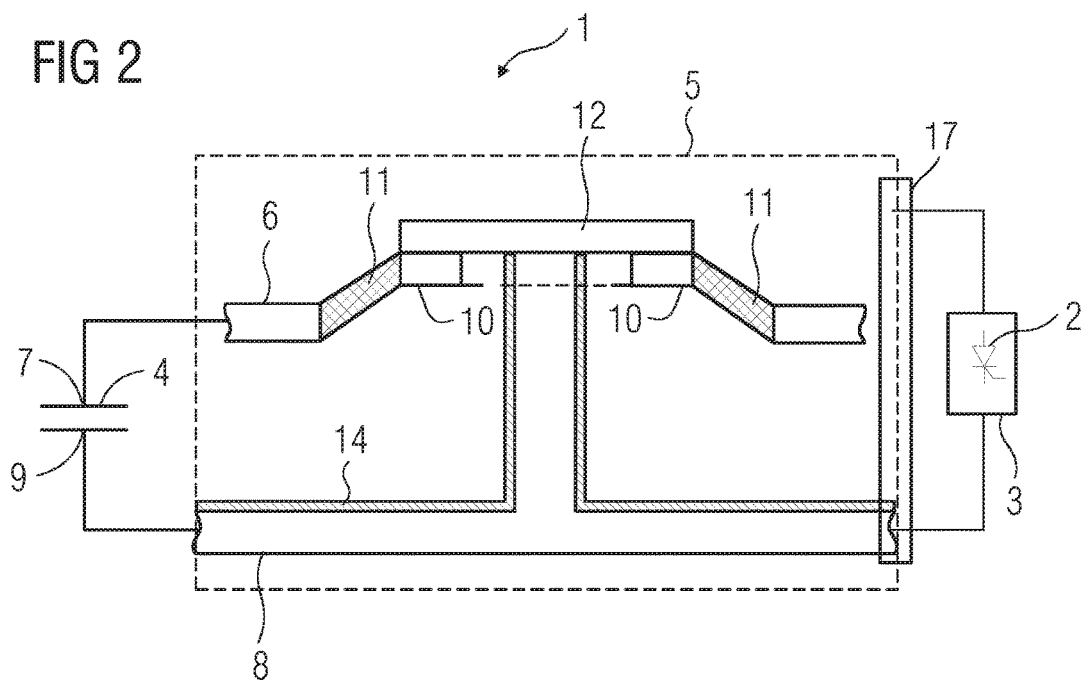

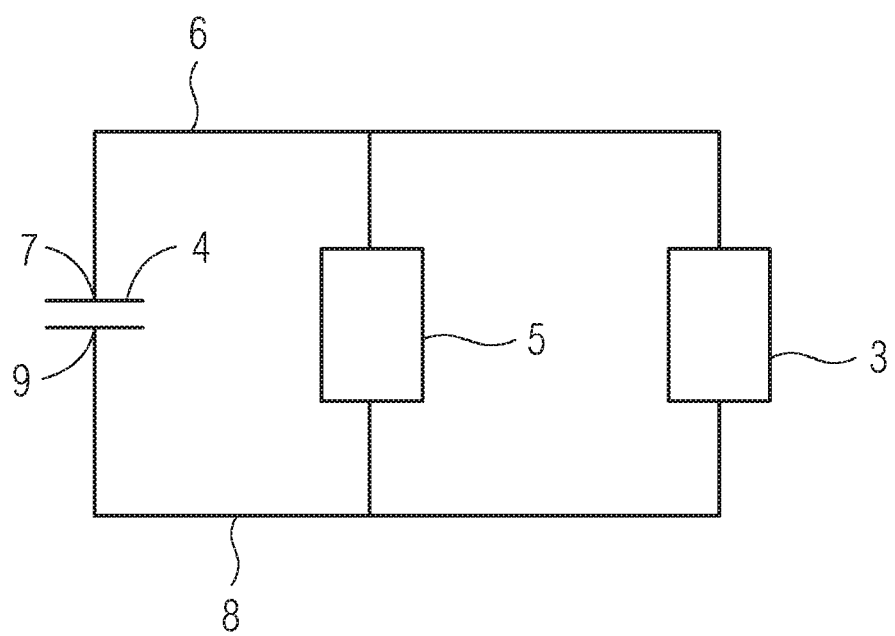

ELECTRONIC MODULE FOR PROTECTING A HVDC CONVERTER FROM CURRENT SURGES OF ENERGY DISCHARGES FROM A CAPACITOR OF THE CONVERTER

BACKGROUND OF THE INVENTION

Field of the Invention

The present invention relates to an electronic module for protecting power semiconductor devices of an HVDC converter and more particularly to a short circuit device for protecting at least one power semiconductor device of an HVDC convertor power module in the event of high current surges or electrical discharges which otherwise may damage the power semiconductor device.

The High Voltage Direct Current (HVDC) systems are used for energy transmission worldwide. These HVDC systems are specifically used to economically transmit electrical energy over long distances via overhead lines or cables. They are also used for the connection of asynchronous grids or grids with different frequencies or for the connection of off-shore wind farms with an on-shore power grid. HVDC systems comprise complex converter stations which are connected by a DC connection. One of the main components in a converter station are HVDC converters which are used for the conversion of electrical power from alternating current (AC) to direct current (DC) or the other way round. These converters have converter arms containing power modules in series connection. These power modules contain power semiconductor devices like thyristors, IGBTs etc. These power semiconductor devices need to be protected against current surges.

The converter arms are often referred to as current valves in literature. A power module of such a converter arm can be a single power semiconductor device, like a thyristor, an IGBT or the like. Modular multilevel converters are provided with power modules having more than one power semiconductor device. The power semiconductor devices are connected with a capacitor in a half-bridge or full-bridge configuration. In the event of a failure, the energy in the capacitor is discharged into the power semiconductor devices of the modules.

This leads to an explosion of the power semiconductor device. In order to control the energies that are released, anti-explosion protection has to be implemented.

European patent EP 1894240 B1 discloses one such protective electronic module. The invention relates to an electronic module having at least a first and a second terminal connected to power semiconductors by means of connecting conductors, each of the power semiconductors has at least one diode connected in parallel to it and the power semiconductors have a capacitor connected in parallel. The connecting conductors have at least two parallel extending portions, at least one of which is deformable, the current flowing in the electronic module is passed in the opposite direction, so that, due to electromagnetic interaction a force is generated which presses apart the connecting conductors, and which are dimensioned so that when a threshold value of current is exceeded, a conductive connection between the terminals is established bypassing both the power semiconductors and the capacitor thereby providing a short circuit path for the current and protecting the power semiconductors from the sudden current surge.

The invention disclosed above, however, does not protect the circuit from the energy discharge taking place from the capacitor. In case of a switching failure, for example, the charge stored in the capacitor discharges through the power semiconductor devices of power modules of HVDC converter, for example through one or all of the IGBTs, and thus damages the power modules.

Therefore a need arises for an effective protection circuit which will protect the power semiconductor devices of power module of HVDC converter not only from a short circuit current but also from the electrical discharges from the capacitor.

BRIEF SUMMARY OF THE INVENTION

It is an object of the present invention to provide for an efficient and cost-effective solution for protecting the power semiconductor devices of HVDC converter power modules from damages due to electric discharges from the capacitor.

The object of the invention is achieved with an electronic module as disclosed which protects power semiconductor devices of an HVDC converter power module against high current surges or high energy discharges from the capacitor. According to the invention the electronic module comprises a capacitor, a short circuit device, a movable portion, a short circuit portion and a spring element. The short circuit device is connected in parallel to the capacitor, wherein the short circuit device comprises a first busbar connected to a first pole of the capacitor and a second busbar connected to a second pole of the capacitor. The movable portion is connected to the first busbar by a flexible connection means and the short circuit portion is connected to the second busbar. The spring element is arranged between the movable portion and the short circuit portion. The movable portion extends in parallel to the second busbar so that when a short circuit current flows through the first busbar an electromagnetic force between the two busbars causes the first busbar to repel the second busbar and move towards the short circuit portion. The short circuit portion provides a short circuit path connecting the first busbar to the second busbar short circuiting the capacitor during a short circuit state of operation of the electronic module. This way the high currents and electric discharges are bypassed through the short circuit portion without reaching the HVDC converter power module.

The high currents during a short circuit generate high forces on the parallel current busbars between the capacitor and the power module. As a result, it was not possible to use plug and socket connections, instead screw connections were being used. According to the present invention the short circuit device is connected between the capacitor and the HVDC converter power modules. As the short circuit current is directed through the short circuit device, strong forces on the busbars arise only in the region between the capacitor and the short circuit device. In this way, it becomes possible to design the connection between the power module and the short circuit device as a plug and socket connection. This has huge benefits in assembly of the converter and promises a significant cost-saving potential.

Forces acting between the two bars depend on factors like the lengths of the busbars, the current flowing through the busbars, the distance between the busbars etc.

In one embodiment of the invention the spring element is not in direct contact with the movable portion and the short circuit portion. In a further embodiment the spring element establishes an indirect connection between the movable portion and the short circuit portion via a separate element.

In another embodiment of the present invention the second busbar is stationary in relation to the movable portion of the first busbar. The second busbar is connected with a stationary or fixed connection with the short circuit portion. In this embodiment only the movable portion of the first busbar moves in the event of a high current flowing through the short circuit device. With lesser movable parts in the electronic module there will be lesser wear and tear and more stability in the short circuit device.

In a further embodiment the second busbar has an insulation lining which is arranged between the second busbar and the first busbar. During a safe operating mode, i.e. when the current through the electronic module is less than a threshold value, the short circuit device allows the current to pass through the power module as the current value is within safe limits and would not damage the power semiconductor devices in the power module. The insulation lining prevents the current from flowing into the second busbar from the first bar during this safe operating mode. The current flows into the power module and the converter operates normally without any fear of damage to the power semiconductor devices. The insulation lining can be an insulating coating of the second busbar. The insulation lining will not affect the magnetic field between the busbars in the event of a failure as the current flowing through the busbars during a short circuit will be several hundred times more than the current flowing during safe operating mode.

In a further embodiment the spring element, arranged between the movable portion and the short circuit portion, is an insulator. In the safe operating mode the spring element is in a normally expanded or a stretched state and the insulator prevents the current from leaking into the short circuit portion from the first bar thereby preventing a short circuit connection between the two busbars. However, when the current crosses the threshold value, i.e. during the short circuit state, the electromagnetic forces between the busbars causes the first busbar to repel the second busbar and move away from the second busbar and instead move towards the short circuit portion. This movement of the first busbar causes the spring element to compress and a conducting path is established between the two busbars through the short circuit portion resulting in a short circuit connection to be established between the two busbars. This short circuit protects the power module by short circuiting the capacitor and bypassing the power module.

In a further embodiment the spring element comprises of a first end connected to the movable portion and a second end connected to the short circuit portion, wherein the first end and the second end are insulated. This will require lesser insulation material and the compressibility of the spring element will not be compromised.

In a further embodiment the flexible connection means comprises a flexible copper band. The flexibility in the copper band ensures smooth motion of the first busbar towards the short circuit portion in the event of a current surge and back to its original position during a safe operation mode of the electronic module. Therefore, the flexible copper band provides a reusability feature to the electronic module so that the module can be used over several current surges and short circuits.

According to a further embodiment the flexible connection means is a copper ribbon, a copper connector or any flexible metal connector.

In a further embodiment the first and the second busbars are copper busbars. Copper being a good conductor of electricity is the best choice for busbars as it provides excellent conductivity. However, any other metal busbar can also be used.

In yet another further embodiment the short circuit portion is made of copper. The short circuit portion provides a short circuit path for the very high current surges and hence the short circuit portion needs to have good conductivity. Copper being a very good conductor of electricity is the best choice. However, any other metal can also be used.

According to a further embodiment the short circuit device comprises a plug and socket connection for connecting to the power semiconductor device of the HVDC converter power module. This makes the assembly of the electronic module much easier and also promises of a significant cost-saving potential.

In a further embodiment the short circuit portion comprises slots for accommodating the compressed spring element during the short circuit state. These slots will ensure proper contact of the movable portion with the short circuit portion during the short circuit state.

The electronic module as described in this invention will find huge application in modular multi-level converters (MMC). Such an MMC comprises converter arms having a series connection of bipolar sub-modules. Each sub-module is provided with a power module forming the two connection clamps of the sub-module and an electronic module according to the invention.

Additionally, the electronic module as disclosed in the present invention can comprise some or all the features which have been mentioned above for the different embodiments of the circuit according to the invention.

The above-mentioned and other features of the invention will now be addressed with reference to the accompanying drawings of the present invention. The illustrated embodiments are intended to illustrate, but not limit the invention. The drawings contain the following figures, in which like numbers refer to like parts, throughout the description and drawings.

BRIEF DESCRIPTION OF THE SEVERAL VIEWS OF THE DRAWING

FIG. 1 is a schematic diagram of an electronic module for protecting at least one power semiconductor device of an HVDC converter.

FIG. 2 illustrates a schematic diagram of the electronic module 1 when the electronic module 1 is in a short circuit state.

FIG. 3 is a block diagram of the arrangement and placement of the short circuit device between the capacitor and the power module of the HVDC converter.

DESCRIPTION OF THE INVENTION

In the following description, for the purpose of explanation, numerous specific details are set forth in order to provide a thorough understanding of one or more embodiments. It may be evident that such embodiments may be practiced without these specific details.

FIG. 1 illustrates a schematic diagram of an electronic module 1 for protecting at least one power semiconductor device 2 of an HVDC converter power module 3. The FIG. 1 shows the state of the electronic module 1 in the safe operating mode. In this mode the current flowing through the electronic module 1 is less than the threshold value above which the power semiconductor device 2 in the HVDC converter power module 3 may be damaged. The electronic module 1 comprises a capacitor 4 and a short circuit device 5. The short circuit device 5 is connected in parallel to the capacitor 4. Further, the short circuit device 5 comprises a first busbar 6 and a second busbar 8, a movable portion 10, a short circuit portion 12 and a spring element 13.

The first busbar 6 is connected to a first pole 7 of the capacitor 4 and the second busbar 8 is connected to a second pole 9 of the capacitor 4. The movable portion 10 is connected to the first busbar 6 by a flexible connection means 11. The short circuit portion 12 is connected with the second busbar 8. The spring element 13 is arranged between the movable portion 10 and the short circuit portion 12. The movable portion 10 is arranged in parallel to the second busbar 8.

Referring now to FIG. 2, it illustrates a schematic diagram of the electronic module 1 when the electronic module 1 is in a short circuit state. In this state the movable portion 10 of the first busbar 6 is repelled away from the second busbar 8 and moves towards the short circuit portion 12 by compressing the spring element 13 (not seen in the figure). This establishes an electrical connection between the first busbar 6 with the second busbar 8 via the short circuit portion 12. This electrical connection short circuits the capacitor 4 and safely drains the high currents coming into the electronic module 1 or drains the electrical discharges from the capacitor 4 through the busbars 6, 8 without letting them to reach the power semiconductor device 2 of the HVDC converter power module 3. Thus the power semiconductor device 2 is protected from damage or explosion due to sudden current surges or high power electrical discharges from the capacitor 4.

FIG. 3 is a block diagram showing the location of the short circuit device 5 between the capacitor 4 and the HVDC converter power module 3. It can be seen from the FIG. 3 that the capacitor 4 has two poles, a first pole 7 and a second pole 9. The first bar 6 is connected to the first pole 7 and the second busbar 8 is connected to the second pole 9. The short circuit device 5 is connected in parallel to the capacitor 4 via the first 6 and the second busbars 8. Further, the HVDC converter power module 3 is connected across the short circuit device 5. The capacitor 4 and the busbars 6, 8 together form the electronic module 1.

Although the invention has been described with reference to specific embodiments, this description is not meant to be construed in a limiting sense. Various modifications of the disclosed embodiments, as well as alternate embodiments of the invention, will become apparent to persons skilled in the art upon reference to the description of the invention. It is therefore contemplated that such modifications can be made without departing from the embodiments of the present invention as defined.

LIST OF REFERENCE SIGNS 1 electronic module
2 power semiconductor device
3 HVDC converter power module
4 capacitor
5 short circuit device
6 first busbar
7 first pole
8 second busbar
9 second pole
10 movable portion
11 flexible connection means
12 short circuit portion
13 spring element
14 insulation lining
15 first end
16 second end
17 plug and socket connection

The invention claimed is:

1. An electronic module for protecting a power semiconductor device of a high voltage direct current (HVDC) converter power module, the electronic module comprising:
   a capacitor having a first pole and a second pole;
   a short circuit device connected in parallel with said capacitor, said short circuit device including:
   a first busbar directly connected to said first pole of said capacitor and a second busbar directly connected to said second pole of said capacitor;
   a movable portion flexibly connected to said first busbar;
   a short circuit portion connected with said second busbar;
   a spring element disposed between said movable portion and said short circuit portion, said movable portion extending parallel to said second busbar so that, when a short circuit current flows through said first busbar, an electromagnetic force repels said first busbar away from said second busbar and towards said short circuit portion.

2. The electronic module according to claim 1, wherein said second busbar is stationary.

3. The electronic module according to claim 1, wherein said second busbar has an insulation lining arranged between said second bus-bar and said first busbar.

4. The electronic module according to claim 1, wherein said spring element is an insulator.

5. The electronic module according to claim 1, wherein said spring element comprises a first end connected to said movable portion and a second end connected to said short circuit portion, and wherein said first and second ends are insulated from one another.

6. The electronic module according to claim 1, further comprising a flexible copper band flexibly connecting said movable portion to said first busbar.

7. The electronic module according to claim 1, wherein said first and second busbars are copper busbars.

8. The electronic module according to claim 1, wherein said short circuit portion is formed of copper.

9. The electronic module according to claim 1, wherein said short circuit device comprises a plug and socket connection for connecting to the high voltage direct current (HVDC) converter power module.

* * * * *